US012756369B2

(12) United States Patent
Srinivasan et al.

(10) Patent No.: US 12,756,369 B2
(45) Date of Patent: Oct. 6, 2026

(54) TUNABLE TRANSCONDUCTOR

(71) Applicant: TEXAS INSTRUMENTS INCORPORATED, Dallas, TX (US)

(72) Inventors: Hariharan Srinivasan, Chennai (IN); Rajavelu Thinakaran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 440 days.

(21) Appl. No.: 18/362,389

(22) Filed: Jul. 31, 2023

(65) Prior Publication Data

US 2024/0297627 A1 Sep. 5, 2024

(30) Foreign Application Priority Data

Mar. 3, 2023 (IN) ............................. 202341014366

(51) Int. Cl.
*H03F 1/56* (2006.01)
*G01R 31/28* (2006.01)
*H03F 3/45* (2006.01)

(52) U.S. Cl.
CPC ..... *H03F 3/45475* (2013.01); *G01R 31/2834* (2013.01); *H03F 1/56* (2013.01); *H03F 2200/261* (2013.01); *H03F 2203/45288* (2013.01)

(58) Field of Classification Search
CPC .. H03F 3/45475; H03F 1/56; H03F 2200/261; H03F 2203/45288; G01R 31/2834
USPC ........... 330/86, 288, 305, 207; 323/315, 316
See application file for complete search history.

(56) References Cited

U.S. PATENT DOCUMENTS 9,583,241 B1 * 2/2017 Dempsey .............. H03M 1/765
2018/0191312 A1 * 7/2018 Mu ...................... H04B 1/1638
2023/0396260 A1 * 12/2023 Dempsey .............. H03F 3/3027

* cited by examiner

*Primary Examiner* — Andrea Lindgren Baltzell
*Assistant Examiner* — Nareh Shamiryan
(74) *Attorney, Agent, or Firm* — Xianghui Huang; Frank D. Cimino

(57) ABSTRACT

In examples, a circuit includes a first and second resistors, a programmable impedance circuit, an amplifier, and a current mirror. The first resistor has a first terminal coupled to a VIN terminal, and a second terminal. The second resistor has a first terminal coupled to the second terminal of the first resistor, and a second terminal coupled to a ground terminal. The programmable impedance circuit has a first terminal coupled to the second terminal of the first resistor, a tuning input, and a third terminal. The amplifier has an inverting input coupled to the ground terminal, a non-inverting input coupled to the third terminal of the programmable impedance circuit, and an output terminal. The current mirror has a first terminal coupled to the output terminal of the amplifier, a second terminal coupled to the third terminal of the programmable impedance circuit, and a third terminal coupled to an IOUT terminal.

20 Claims, 6 Drawing Sheets

TUNABLE TRANSCONDUCTOR

CROSS-REFERENCE TO RELATED APPLICATIONS

The present application claims priority to India Provisional Patent Application No. 202341014366, which was filed Mar. 3, 2023, is titled "Linear Programmable Bi-Directional Transconductor," and is hereby incorporated herein by reference in its entirety.

BACKGROUND

A transconductance amplifier is a voltage-controlled current source. The transconductance amplifier receives a first signal having a particular voltage value and provides a second signal having a particular current value that is determined, at least in part, based on the voltage value. A relationship between the voltage value and the current value (e.g., the gain of the transconductance amplifier) is referred to as a transconductance of the transconductance amplifier.

SUMMARY

In some examples, a circuit includes a first resistor, a second resistor, a programmable impedance circuit, an amplifier, and a current mirror. The first resistor has a first terminal coupled to an input voltage (VIN) terminal, and having a second terminal. The second resistor has a first terminal coupled to the second terminal of the first resistor, and having a second terminal coupled to a ground terminal. The programmable impedance circuit has a first terminal coupled to the second terminal of the first resistor, having a tuning input terminal, and having a third terminal. The amplifier has an inverting input coupled to the ground terminal, a non-inverting input coupled to the third terminal of the programmable impedance circuit, and having an output terminal. The current mirror has a first terminal coupled to the output terminal of the amplifier, a second terminal coupled to the third terminal of the programmable impedance circuit, and a third terminal coupled to an output current (IOUT) terminal.

In some examples, a circuit includes a voltage divider, a programmable impedance circuit, a current mirror, and an amplifier. The voltage divider is configured to receive VIN and provide a divided input voltage (VINDIV). The programmable impedance circuit is coupled to the voltage divider. The programmable impedance circuit is configured to receive VINDIV, receive a digital tuning code, and modify an impedance of the programmable impedance circuit, as presented to an outside component, based on a value of the digital tuning code. The current mirror is coupled to the programmable impedance circuit and IOUT terminal. The amplifier is coupled in a negative feedback topology to the programmable impedance circuit and the current minor. The amplifier is configured to drive the current minor to cause the current mirror to provide IOUT at the IOUT terminal having an amount of current based on VIN and linearly proportional to the digital tuning code.

In some examples, a method includes receiving an input voltage and a tuning code. The method also includes modifying an impedance of a programmable impedance circuit based on the tuning code. The method also includes, providing an output current based on a value of the input voltage and a value of the tuning code.

DETAILED DESCRIPTION

As described above, a transconductance amplifier receives a first signal having a particular voltage value and provides a second signal having a particular current value that is determined, at least in part, based on the voltage value. A relationship between the voltage value and the current value (e.g., the gain of the transconductance amplifier) is referred to as a transconductance of the transconductance amplifier.

In some implementations, the transconductance of a transconductance amplifier is specified at a time of manufacture of the transconductance amplifier, such as according to a ratio of impendences provided by separate components of the transconductance amplifier. However, it may be useful in some application environments to provide programmability, or tuning, to the transconductance amplifier. For example, a parametric measurement unit (PMU) is a form of automatic test equipment (ATE). In some operational modes, the PMU provides a voltage to a device under test (DUT). The PMU provides the voltage as a forced voltage to measure a response of the DUT in the presence of that voltage. However, external effects, such as an impedance of a conductor or connector coupling the DUT to the PMU may affect accuracy of the measurement. By tuning or programming the transconductance of a transconductance amplifier, effects of the impedance of the conductor or connector coupling the DUT to the PMU may be mitigated in a voltage measurement performed by the PMU. In various other implementations, programmability or tunability of the transconductance may be useful in a function generator, such as an automatic waveform generator, and any other device in which it may be useful to modify gain of a voltage-controlled current source.

Examples of this description provide for a programmable transconductor, or transconductance amplifier. The transconductor receives an input voltage (VIN) and provides an output current (IOUT) based on a gain, or transconductance, of the transconductor, and a tuning value. For example, the transconductor provides IOUT having a value determined according to VIN multiplied by the gain of the transconductor, and divided by an impedance specified by the tuning value. In some examples, the tuning value is a digital code received from a controller or other device coupled to the transconductor. In some examples, the transconductor is bi-directional (e.g., capable of providing IOUT based on a positive value VIN or a negative value VIN). In other examples, the transconductor is uni-directional (e.g., capable of providing VOUT based on a negative value VIN).

Figure 1:
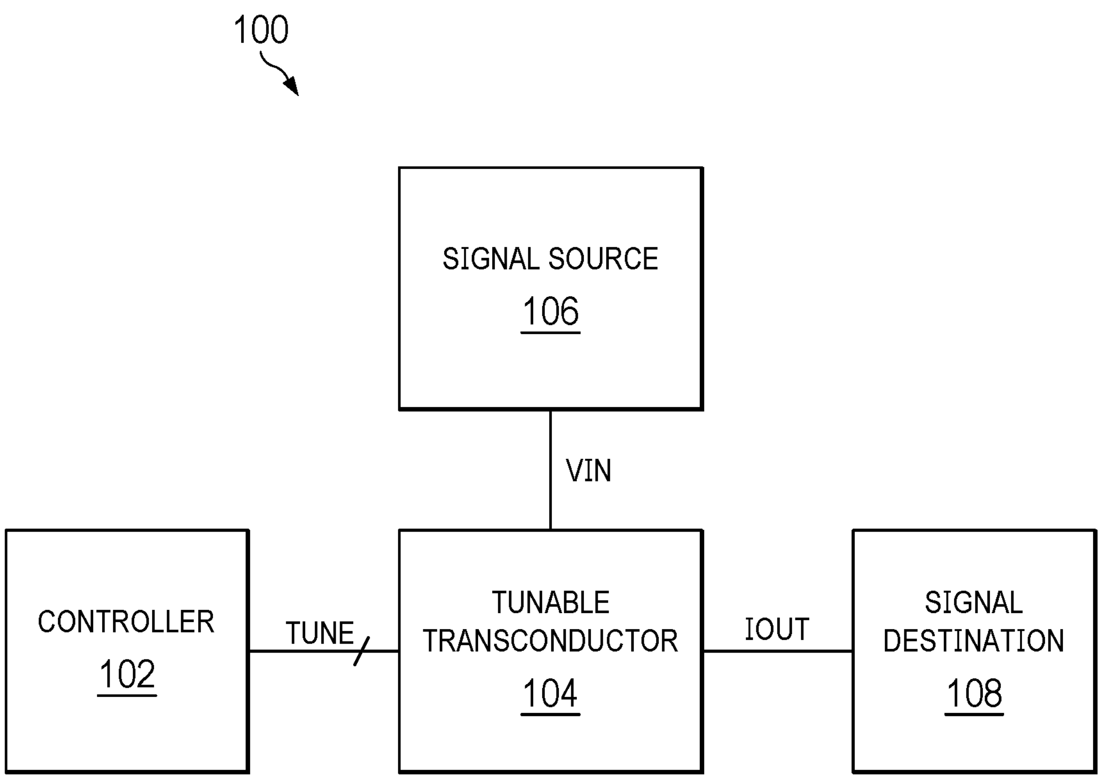
FIG. 1 is a block diagram of an example system.

FIG. 1 is a block diagram of an example system 100. The system 100 may be generally representative of any device in which it is useful to include a voltage-controller current source. In an example, the system 100 is representative of a PMU. In other examples the system 100 is representative of a function generator, such as an automatic waveform generator.

In an example, the system 100 includes a controller 102, a tunable transconductor 104, a signal source 106, and a signal destination 108. The controller 102 is coupled to the tunable transconductor 104 and may control the tunable transconductor 104. For example, the controller 102 provides a digital tuning code (TUNE) to the tunable transconductor 104. In various examples, TUNE may include any number of bits determined to be suitable or useful for an application environment of the system 100. The tunable transconductor 104 receives VIN from the signal source 106 and provides IOUT to the signal destination 108 based on a gain of the tunable transconductor 104 and a value of TUNE. In various examples, the signal source 106 and the signal destination 108 may each be any respective circuit(s), component(s), or device(s), the scope of which is not limited herein.

Figure 2:
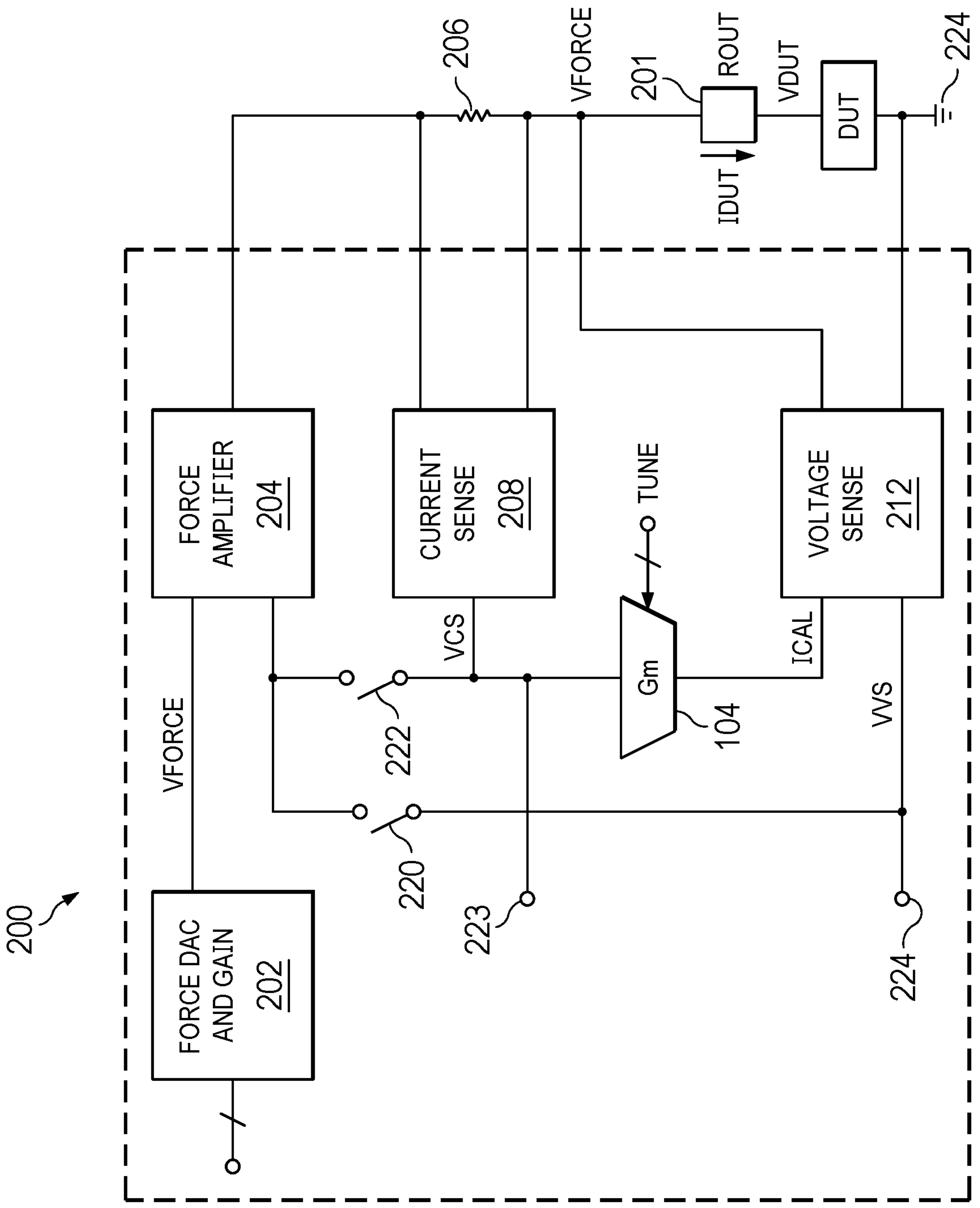
FIG. 2 is a block diagram of an example parametric measurement unit (PMU).

FIG. 2 is a block diagram of an example PMU 200. In an example, the PMU 200 includes a force digital-to-analog converter (DAC) and gain circuit 202 (also referred to as the gain circuit 202), a force amplifier circuit 204, a resistor 206, a current sense circuit 208, a voltage sense circuit 212, and the tunable transconductor 104. The PMU 200 also includes switches 220 and 222. In some examples, the resistor 206 is not a component of the PMU 200 but instead couples to the PMU 200. In an example, the current sense circuit 208 of FIG. 2 is the signal source 106 of FIG. 1, and the voltage sense circuit 212 is the signal destination 108 of FIG. 1. In such examples, VCS is VIN, and ICAL is IOUT.

In an example architecture of the PMU 200, the gain circuit 202 includes an input and an output. In some examples, a digital signal useful in providing a forced voltage (VFORCE) at a specified value is received at the input. The force amplifier circuit 204 has first and second inputs and an output. The first input of the force amplifier circuit 204 is coupled to the output of the gain circuit 202 to receive VFORCE. The resistor 206 has a first terminal coupled to the output of the force amplifier circuit 204 and a second terminal coupled to a connector 201, such as via a terminal of the PMU 200. The connector 201 may be of any suitable form, such as a wire, cable, or other conductor that couples the second terminal of the resistor 206 to the DUT.

The current sense circuit 208 has a first input coupled to the first terminal of the resistor 206, a second input coupled to the second terminal of the resistor 206, and an output. The tunable transconductor 104 includes first and second inputs, and an output. In some examples, the first input of the tunable transconductor 104 is coupled to the controller 102 and receives TUNE. The second input of the tunable transconductor 104 is coupled to the output of the current sense circuit 208.

In some examples, the voltage sense circuit 212 has first, second, and third inputs, and an output. The first input of the voltage sense circuit 212 is coupled to the connector 201, such as via a terminal of the PMU 200. The second input of the voltage sense circuit 212 is coupled, in some examples, to a ground terminal 224 at which a ground voltage potential is provided. The third input of the voltage sense circuit 212 is coupled to the output of the tunable transconductor 104. The switch 220 has a first terminal coupled to the output of the voltage sense circuit 212 and a second terminal coupled to the second input of the force amplifier circuit 204. The switch 222 has a first terminal coupled to the output of the current sense circuit 208 and a second terminal coupled to the second input of the force amplifier circuit 204. Although not shown in FIG. 2, in some examples, the switches 220, 222 each have a respective control terminal which may be coupled to any suitable circuit, component, or device to receive control signals for controlling a state of the respective switch. In some examples, the control terminals are coupled to the controller 102. In some examples, the switches 220, 222 are implemented as transistor devices, such as field effect transistors (FETs).

In an example of operation of the PMU 200, a digital signal is received at the input of the gain circuit 202. In some examples, the digital signal is received from the controller 102. The gain circuit 202 provides VFORCE having a value determined based on the received digital signal. The force amplifier circuit 204 receives VFORCE and a signal provided by the voltage sense circuit 212 (VVS) and modifies a value of VFORCE through negative feedback based on VVS. The voltage sense circuit 212 measures a voltage at a device under test (DUT), where the voltage is referred to as VDUT, to provide VVS. In some examples, the current sense circuit 208 determines or measures a current flowing through the connector 201 (IDUT) by providing a signal (VCS) having a value based on a voltage measured across the resistor 206. In some examples, the PMU 200 provides VCS and VVS to another component via terminals 223 and 224, respectively, such as to the controller 102 or any other suitable intermediate component (not shown).

In some examples, VDUT varies from VFORCE in response to a parasitic resistance of the connector 201 (e.g., ROUT). This variation may adversely affect operation of the PMU 200, such as by affecting the accuracy of VVS. To compensate for the variation, the tunable transconductor 104 receives VCS from the current sense circuit 208 and receives TUNE, such as from the controller 102. In some examples, TUNE has a value proportional to ROUT. Based on VCS and TUNE, the tunable transconductor 104 provides a calibration current (ICAL), which may be the same as IOUT, as described above with respect to FIG. 1. For example, the tunable transconductor 104 scales (e.g., multiplies) VCS based on TUNE to determine a value of ICAL. In some examples, ROUT is based on a length of the connector 201. In other examples, an approximate value for ROUT may be selected and the PMU 200 may fine tune ICAL to cause VDUT to approximately equal VFORCE.

In some examples, as shown in FIG. 2, the tunable transconductor 104 provides ICAL to the voltage sense circuit 212 to mitigate the variation in VDUT from VFORCE based on ROUT. In other examples, although not shown in FIG. 2, the output of the tunable transconductor 104 is not coupled to the voltage sense circuit 212. Instead, the output of the tunable transconductor 104 is coupled to the first input of the force amplifier circuit 204. In such an example, the tunable transconductor 104 provides ICAL to the force amplifier circuit 204 to mitigate the variation in VDUT from VFORCE based on ROUT. An architecture and operation of the PMU 200 of FIG. 2 is further described in U.S. patent application Ser. No. 18/344,623, which was filed Jun. 29, 2023, is titled "Calibration for Routing Resistance Induced Error," and is hereby incorporated herein by reference in its entirety.

Figure 3:
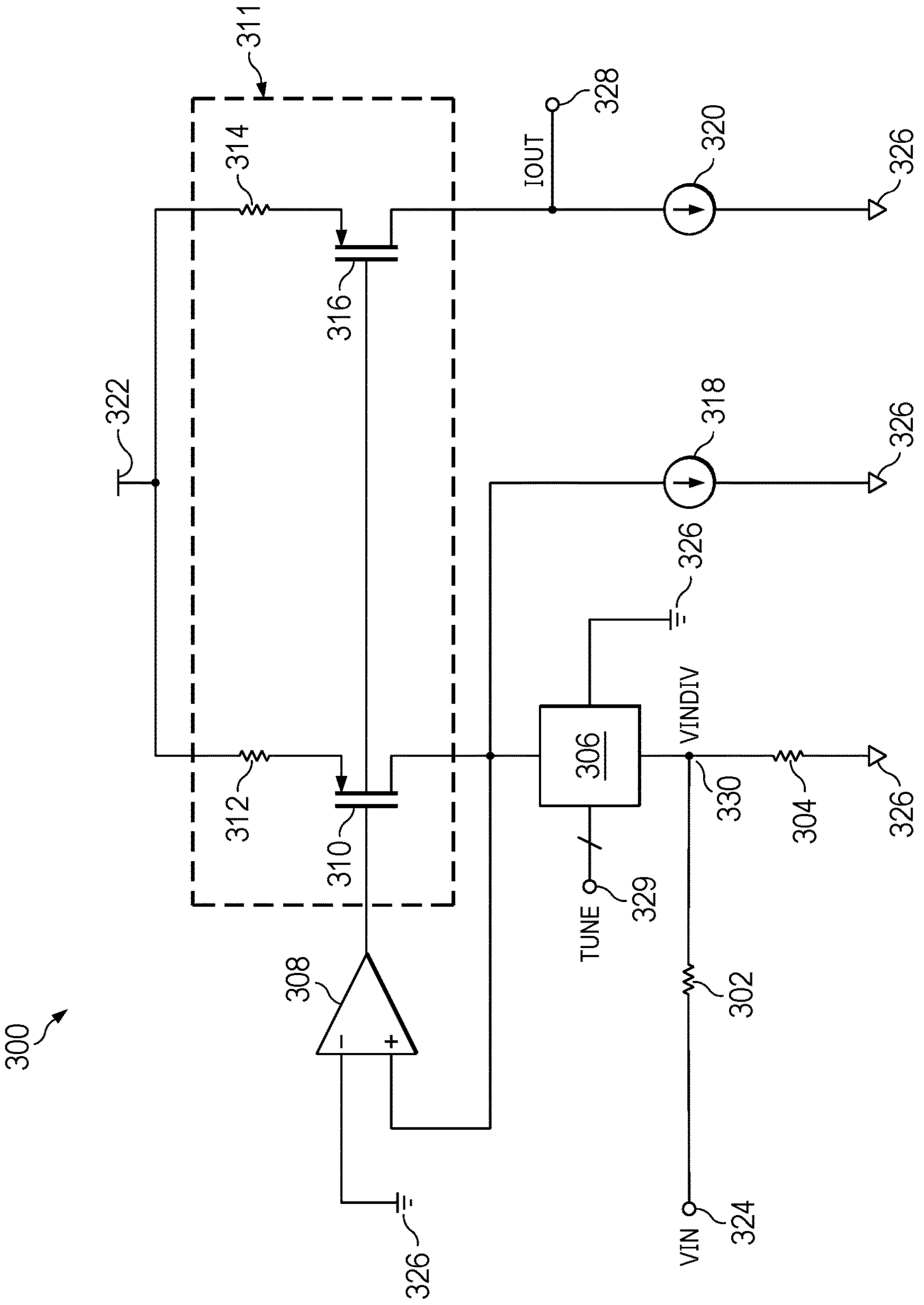
FIG. 3 is a schematic diagram of an example tunable transconductor.

FIG. 3 is a schematic diagram of an example tunable transconductor 300, which may be implemented as the tunable transconductor 104. In an example, the tunable transconductor 300 includes a resistor 302, a resistor 304, a programmable impedance circuit 306, an amplifier 308, a transistor 310, a resistor 312, a resistor 314, and a transistor 316. In some examples, the resistor 302 has a resistance of R and the resistor 304 has a resistance of R/200. In other examples, the resistor 302 and the resistor 304 have any other suitable ratio. In some examples, the resistor 312 and the resistor 314 have approximately a same resistance. In some examples, the transistor 310 and the transistor 316 are each p-channel FETs. In some examples, the tunable transconductor 300 includes a current source 318 and a current source 320. In some examples, the tunable transconductor 300 includes a voltage source 322. In other examples, the tunable transconductor 104 does not include the voltage source 322, but rather is coupled to the voltage source 322.

In an example architecture of the tunable transconductor 300, the resistor 302 has a first terminal coupled to a VIN terminal 324, and has a second terminal. In examples in which the tunable transconductor 300 is implemented as the tunable transconductor 104, the VIN terminal 324 is coupled to the output of the current sense circuit 208 and receives VCS. The resistor 304 has a first terminal coupled to the second terminal of the resistor 302, and has a second terminal coupled to a ground terminal 326 at which a ground voltage potential (e.g., approximately 0 volts (V)) is provided. In some examples, the resistor 302 and the resistor 304 together form a voltage divider having an input at the VIN terminal 324 and an output and a point of coupling between the resistor 302 and the resistor 304 (e.g., at the second terminal of the resistor 302 and/or the first terminal of the resistor 304), illustrated as a node 330. The programmable impedance circuit 306 has a first terminal coupled to a tuning input terminal 329, a second terminal coupled to the second terminal of the resistor 302, a third terminal coupled to the ground terminal 326, and has a fourth terminal. In some examples, the tuning input terminal 329 is a terminal of the programmable impedance circuit 306. In some examples, the tuning input terminal 329 is coupled to the controller 102. The amplifier 308, which may be an operational amplifier, has a negative or inverting input terminal coupled to the ground terminal 326, a positive or non-inverting input terminal coupled to the fourth terminal of the programmable impedance circuit 306, and has an output terminal. The transistor 310 has a control terminal coupled to the output terminal of the amplifier 308, a first terminal coupled to the fourth terminal of the programmable impedance circuit 306, and has a second terminal. The resistor 312 has a first terminal coupled to the voltage source 322, and has a second terminal coupled to the second terminal of the transistor 310. In an example, the control terminal of the transistor 310 is a gate, the first terminal of the transistor 310 is a drain, and the second terminal of the transistor 310 is a source. The resistor 314 has a first terminal coupled to the voltage source 322, and has a second terminal. The transistor 316 has a control terminal coupled to the output terminal of the amplifier 308, a first terminal coupled to the second terminal of the resistor 314, and has a second terminal coupled to an IOUT terminal 328 at which IOUT is provided.

In examples of the tunable transconductor 300 that include the current source 318 and the current source 320, the current source 318 has a first terminal coupled to the fourth terminal of the programmable impedance circuit 306, and has a second terminal coupled to the ground terminal 326. In the same example, the current source 320 has a first terminal coupled to the IOUT terminal 328, and has a second terminal coupled to the ground terminal 326.

In an example of operation of the tunable transconductor 300, VIN is received at the VIN terminal 324 and TUNE is received at the tuning input terminal 329, such as from the controller 102. In some examples, tune is a digital code having a number of bits n such that TUNE is representable as TUNE[n−1:0], and individual bits of TUNE are representable as TUNE[0], TUNE[1], TUNE[2], . . . TUNE[n−1]. In an example, an inverse of TUNE may be referred to as TUNE', and may be otherwise representable in a manner similar to TUNE. In examples of the tunable transconductor 300 which do not include the current source 318 and the current source 320, the tunable transconductor 300 may be functional for VIN having a negative value. In examples of the tunable transconductor 300 which include the current source 318 and the current source 320, the tunable transconductor 300 may be functional for VIN having a positive value or having a negative value.

The amplifier 308 is coupled in a negative feedback topology that causes the non-inverting terminal of the amplifier 308 to have a value approximately equal to a value provided at the inverting terminal of the amplifier 308. Because the inverting input of the amplifier 308 is coupled to the ground terminal 326, the non-inverting terminal of the amplifier 308 is also held at a value of approximately 0 V. In this way, the non-inverting terminal of the amplifier 308 may be referred to as a virtual ground, or VGND. Because the inverting terminal of the amplifier 308 is coupled to the ground terminal 326, the non-inverting terminal of the amplifier 308 is held at VGND.

VIN is divided by the voltage divider formed by the resistors 302, 304 to form VINDIV at the node 330. VINDIV has a value determined based on a ratio of resistances of the resistor 302 and the resistor 304. VINDIV is fed into the programmable impedance circuit 306, which has a variable or programmable impedance determined based on a value of TUNE. The programmable impedance circuit 306 creates an asymmetric impedance in the tunable transconductor 300. For example, an impedance seen by the voltage divider formed of the resistors 302, 304 remains constant across changing codes of TUNE. However, a resistance between the output of the voltage divider (e.g., the node 330) and the non-inverting terminal of the amplifier 308 scales approximately linearly across changing codes of TUNE.

In an example, the transistors 310, 316 are matched (e.g., have approximately the same width and length characteristics). Also, the transistors 310, 316 are arranged as (along with the resistors 312, 314) a current mirror 311, such that an amount of current flowing through the transistor 316 is approximately equal to an amount of current flowing through the transistor 310. In other examples, one of the transistors 310, 316 is scaled with respect to the other, providing corresponding scaling to the current flowing through the transistor 316 with respect to current flowing through the transistor 316.

The output signal of the amplifier 308 causes the transistors 310, 316 to be conductive such that current flows between their respective source and drain terminals. In some examples, the current flowing through the transistor 310 scales with changes in value of TUNE. For example, as TUNE increases in value, an impedance of the programmable impedance circuit 306 as seen at the drain of the transistor 310 increases, and current flowing through the transistor 310 increases. Similarly, as TUNE decreases in value, the impedance of the programmable impedance circuit 306 as seen at the drain of the transistor 310 decreases, and current flowing through the transistor 310 decreases. In some examples, a change in value of the current flowing through the transistor 310 is approximately linear with respect to a change in value of TUNE (e.g., a change in impedance of the programmable impedance circuit 306). The current flowing through the transistor 310 is mirrored such that an approximately equal amount of current (in examples in which the transistors 310, 316 are matched) flows through the transistor 316 to cause IOUT to be provided at the IOUT terminal 328. In an example, a value of IOUT is determined according to the following equations (1), (2), and (3):

$$I\text{ OUT} = \frac{VINDIV}{R306}, \tag{1}$$

$$VINDIV = V\ IN * \text{gain, and} \tag{2}$$

$$\text{gain} = \frac{R304 \| R306}{R302 + (R304 \| R306)}, \tag{3}$$

in which R302 is a resistance of the resistor 302, R304 is a resistance of the resistor 304, and R306 is determined according to the following equation (4):

$$R306 = \frac{\text{R\_Large}}{2^{n-1}}, \tag{4}$$

in which R_Large is a largest impedance value achievable in the programmable impedance circuit 306, and n is a number of bits of TUNE.

As described above, some examples of the tunable transconductor 300 include the current source 318 and the current source 320. In such examples, to facilitate functionality of the tunable transconductor 300 for positive values of VIN, the current source 318 draws (or sinks) current equal to an offset amount through the transistor 310. For example, in the presence of a positive value of VIN and in the absence of the current source 318, current would tend to flow from the VIN terminal 324 to the voltage source 322, which may be an undesirable result in some application environments. By including the current source 318, which draws an offset current through the transistor 310, the tunable transconductor 300 provides for current flow from the voltage source 322 irrespective of a polarity of VIN, rather than to the voltage source 322. Because the current source 318 increases a current flowing through the transistor 310, which is therefore mirrored to flow through the transistor 316, by the offset amount, the current source 320 draws the same offset amount of current from the IOUT terminal 328. In some examples, this provides IOUT having a value independent of (e.g., substantially unaffected by) the offset current drawn by the current sources 318, 320, thereby providing IOUT as a tunable voltage-controlled current source (e.g., transconductor) based on values of VIN and TUNE.

Figure 4:
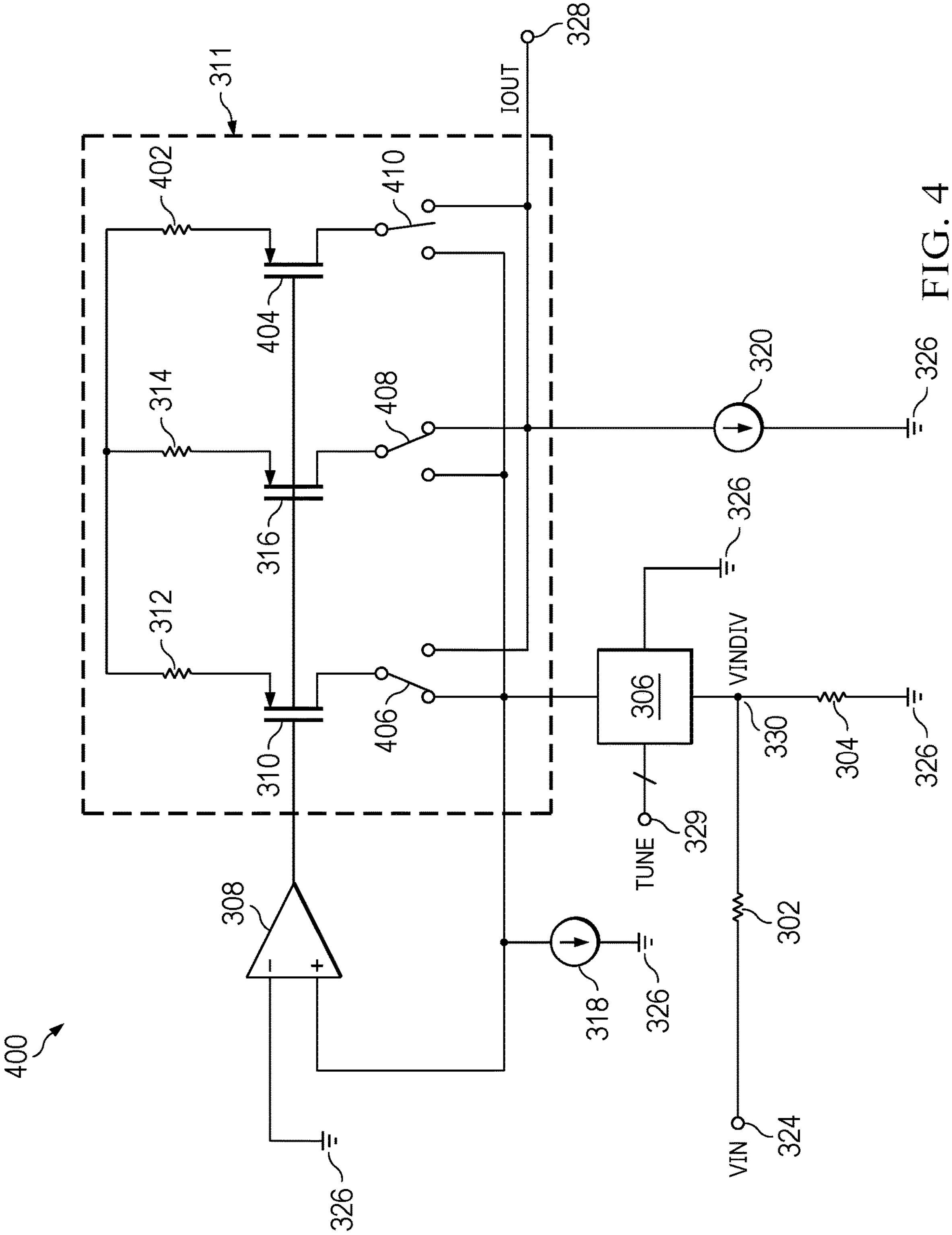
FIG. 4 is a schematic diagram of an example tunable transconductor.

FIG. 4 is a schematic diagram of another example tunable transconductor 400, which may be implemented as the tunable transconductor 104. In an example, the tunable transconductor 400 includes the resistor 302, the resistor 304, the programmable impedance circuit 306, the amplifier 308, the transistor 310, the resistor 312, the resistor 314, the transistor 316, a resistor 402, a transistor 404, a switch 406, a switch 408, and a switch 410. In an example, the switches 406, 408, 410 are single pole, three throw switches capable of coupling a first node to either a second node or a third node, or being in a disconnected state. In some examples, the switches 406, 408, 410 are implemented as solid-state devices, such as transistors, that collectively provide the single pole, three throw functionality. For example, each of the switches 406, 408, 410 may be implemented as a pair of FETs. In some examples, the tunable transconductor 400 also includes the current sources 318, 320.

As described above with respect to FIG. 3, the transistors 310 and 316 may have approximately the same width and length characteristics such that an approximately same amount of current flows through the transistor 316 as flows through the transistor 310. However, process variation in the manufacturing of transistors may cause mismatches between the transistors 310, 316. In the configuration of the tunable transconductor 300 shown in FIG. 3, these mismatches may adversely affect linearity of the tunable transconductor 300 (e.g., the linear relationship between IOUT and VIN). The tunable transconductor 400 mitigates the effects of these mismatches by implementing dynamic element matching (DEM). DEM introduces the resistor 402, the transistor 404, and the switches 406, 408, 410 to the tunable transconductor 400 in comparison to the tunable transconductor 300 of FIG. 3. In an example, the transistor 404 has approximately the same width and length characteristics as the transistors 310, 316 such that an approximately same amount of current flows through the transistor 404 as flows through the transistors 310, 316

In an example architecture of the tunable transconductor 400, the resistor 302 has a first terminal coupled to a VIN terminal 324, and has a second terminal. In examples in which the tunable transconductor 400 is implemented as the tunable transconductor 104, the VIN terminal 324 is coupled to the output of the current sense circuit 208 and receives VCS. The resistor 304 has a first terminal coupled to the second terminal of the resistor 302, and has a second terminal coupled to the ground terminal 326. In some examples, the resistor 302 and the resistor 304 together form a voltage divider having an input at the VIN terminal 324 and an output and a point of coupling between the resistor 302 and the resistor 304 (e.g., at the second terminal of the resistor 302 and/or the first terminal of the resistor 304), illustrated as a node 326. The programmable impedance circuit 306 has a first terminal coupled to a tuning input terminal 329, a second terminal coupled to the second terminal of the resistor 302, a third terminal coupled to the ground terminal 326, and has a fourth terminal. In some examples, the tuning input terminal 329 is a terminal of the programmable impedance circuit 306. In some examples, the tuning input terminal 329 is coupled to the controller 102. The amplifier 308, which may be an operational amplifier, has a negative or inverting input terminal coupled to the ground terminal 326, a positive or non-inverting input terminal coupled to the fourth terminal of the programmable impedance circuit 306, and has an output terminal. The transistor 310 has a control terminal coupled to the output terminal of the amplifier 308, and has a first terminal and a second terminal. The resistor 312 has a first terminal coupled to the voltage source 322, and has a second terminal coupled to the second terminal of the transistor 310. In an example, the control terminal of the transistor 310 is a gate, the first terminal of the transistor 310 is a drain, and the second terminal of the transistor 310 is a source. The resistor 314 has a first terminal coupled to the voltage source 322, and has a second terminal. The transistor 316 has a control terminal coupled to the output terminal of the amplifier 308, a first terminal coupled to the second terminal of the resistor 314, and has a second terminal.

The resistor 402 has a first terminal coupled to the voltage source 322, and has a second terminal. The transistor 404 has a control terminal coupled to the output terminal of the amplifier 308, a first terminal coupled to the second terminal of the resistor 402, and has a second terminal. The switch

406 has a first terminal coupled to the second terminal of the transistor 310, a second terminal coupled to the fourth terminal of the programmable impedance circuit 306, and a third terminal coupled to the IOUT terminal 328. The switch 408 has a first terminal coupled to the second terminal of the transistor 316, a second terminal coupled to the fourth terminal of the programmable impedance circuit 306, and a third terminal coupled to the IOUT terminal 328. The switch 410 has a first terminal coupled to the second terminal of the transistor 404, a second terminal coupled to the fourth terminal of the programmable impedance circuit 306, and a third terminal coupled to the IOUT terminal 328.

In an example of operation of the tunable transconductor 400, the transistors 310, 316, and 404 are rotated or cycled between being coupled to the fourth terminal of the programmable impedance circuit 306 and the IOUT terminal 328. For example, in a first cycle, the switch 406 couples the transistor 310 to the fourth terminal of the programmable impedance circuit 306 and the switch 408 couples the transistor 316 to the IOUT terminal 328. In a second cycle, the switch 408 couples the transistor 316 to the fourth terminal of the programmable impedance circuit 306 and the switch 410 couples the transistor 404 to the IOUT terminal 328. In a third cycle, the switch 410 couples the transistor 404 to the fourth terminal of the programmable impedance circuit 306 and the switch 406 couples the transistor 310 to the IOUT terminal 328. In this way, any effect of mismatch among the transistors 310, 316, 404 on linearity of the tunable transconductor 400 is mitigated. The switches 406, 408, 410 may be controlled by a controller, such as the controller 102 of FIG. 1 (not shown in FIG. 4). In some examples, the controller controls the coupling and decoupling of the switches to rotate according to any suitable random or cyclic pattern with any suitable timing, the scope of which is not limited herein. In other regards, the tunable transconductor 400 may operate in a manner substantially similar to the tunable transconductor 300 to provide IOUT based on VIN and TUNE, and such description is not repeated again with respect to FIG. 4.

Figure 5:
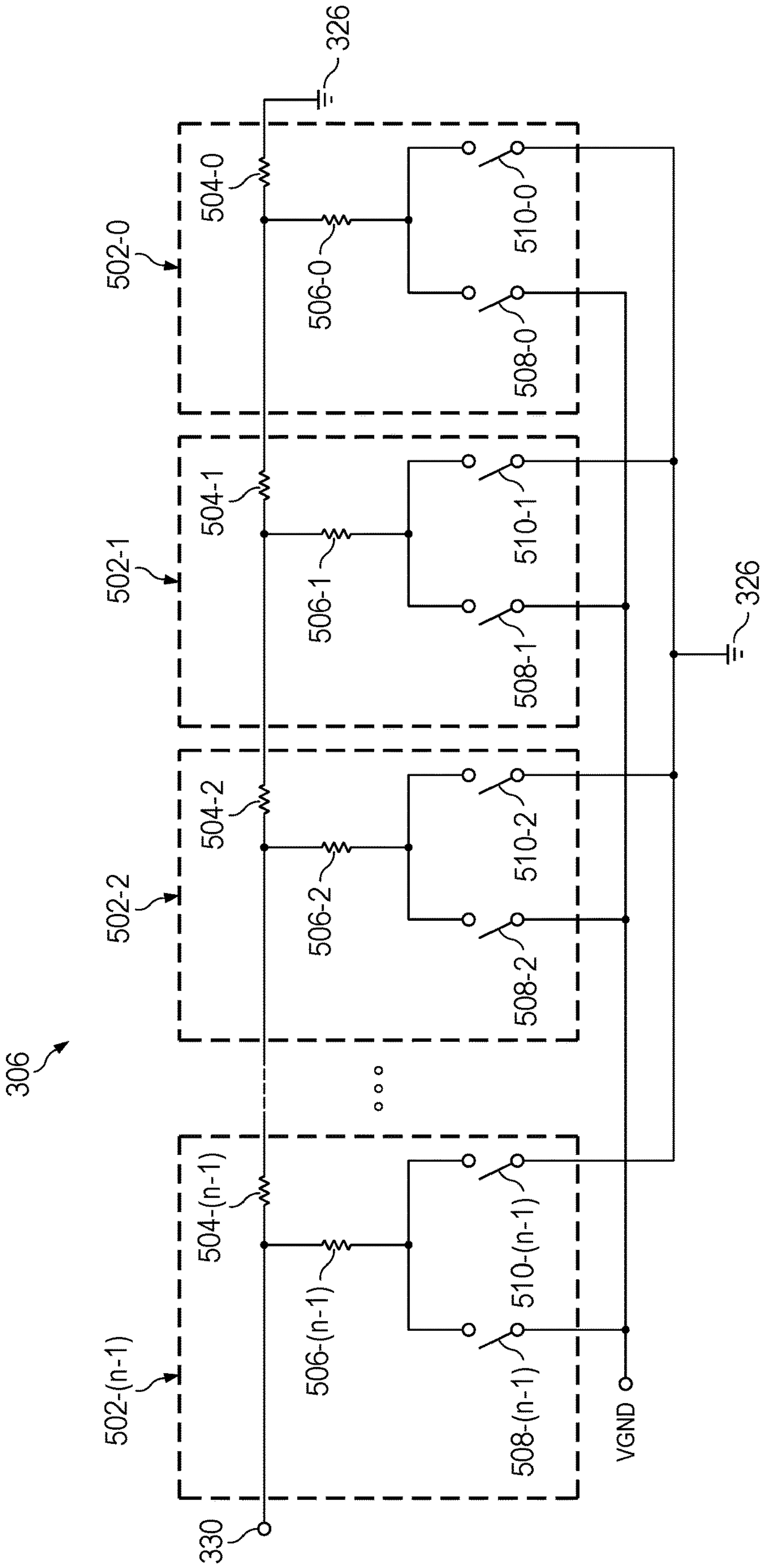
FIG. 5 is a schematic diagram of an example programmable impedance circuit.

FIG. 5 is a block diagram of an example programmable impedance circuit 306. In an example, the programmable impedance circuit 306 includes a number n of segments 502 (e.g., 502-0, 502-1, . . . 502-(n−1)), which may be the same as a number of bits of TUNE. Each segment 502 includes a resistor 504 (e.g., 504-0, 504-1, . . . 504-(n−1)), a resistor 506 (e.g., 506-0, 506-1, . . . 506-(n−1)), a switch 508 (e.g., 508-0, 508-1, . . . 508-(n−1)), and a switch 510 (e.g., 510-0, 510-1, . . . 510-(n−1)). A respective segment 502 receives a corresponding bit of TUNE. For example, segment 502-0 receives TUNE[0], segment 502-1 receives TUNE[1], and segment 502-(n−1) receives TUNE[n−1]. In some examples, for each segment 502, each resistor 506 has a resistance approximately two times a resistance of the resistor 504, with an exception that the resistor 504-0 may have a resistance approximately the same as the resistor 506-0. The example of the programmable impedance circuit 306 shown in FIG. 3 may be referred to as a switched R-2R resistor ladder having an input coupled to the node 330, and output coupled to the non-inverting input terminal, of the amplifier 308, and control input coupled to the tuning input terminal 329, and being coupled to the ground terminal 326. For example, the resistors 504, 506 form the R-2R resistor ladder, which may be switched according to the switches 508, 510 into, or out of, a path of current flow in the programmable impedance circuit 306 based on TUNE.

In an example architecture of the programmable impedance circuit 306, the segment 502-(n−1) is coupled to the node 330 (e.g., is an input, or first terminal, of the programmable impedance circuit 306. The segments 502-(n−2) to 502-0 are coupled sequentially between the segment 502-(n−1) and the ground terminal 326. The resistor 504-(n−1) has a first terminal which may be an input terminal of the segment 502-(n−1) (e.g., may couple to the node 330), and has a second terminal. The resistor 506-(n−1) has a first terminal coupled to the first terminal of the resistor 504-(n−1), and has a second terminal which may be an output terminal of the segment 502-(n−1) (e.g., may couple to the input terminal of a subsequent segment 502, or may couple to the ground terminal 326 if the segment is the segment 502-0). The switch 508-(n−1) has a first terminal coupled to the second terminal of the resistor 504-(n−1), and has a second terminal coupled to a virtual ground (e.g., coupled to the non-inverting input terminal of the amplifier 308). The switch 510-(n−1) has a first terminal coupled to the second terminal of the resistor 504-(n−1), and has a second terminal coupled to the ground terminal 326. In some examples, the switch 508-(n−1) and the switch 510-(n−1) each also have a control terminal. Which may be coupled to a controller (not shown) or other circuitry for controlling respective switching states of the switch 508-(n−1) and the switch 510-(n−1). In an example, coupling of remaining segments 502 may be understood by referring to the segment 502-(n−1), and description for each segment 502 is not made herein.

In an example of operation, a switching state of the switch 508-(n−1) is determined according to a value of TUNE[n−1] and a switching state of the switch 510-(n−1) is determined according to a value of TUNE'[n−1]. In this way, the switching states of the switch 508-(n−1) and the switch 510-(n−1) may be inverse, or complimentary such that while one switch is open, the other switch is closed, and vice versa. In various examples, TUNE'[x] may be formed based on TUNE[x] according to any suitable process, such as a digital logic inversion performed by an inverter circuit (not shown), the scope of which is not limited herein. Based on switching states of the switches 508-(n−1) and 510-(n−1), determined based on TUNE[n−1], an impedance provided or seen at the non-inverting input of the amplifier 308 (e.g., at VGND) is modified. By modifying the impedance provided or seen at the non-inverting input of the amplifier 308, current flowing through the transistor 310, and correspondingly the transistor 316, is modified, modifying a value of IOUT with respect to a substantially unchanging value of VIN.

Although not shown in FIG. 5, in some examples, each segment 502 may instead be implemented in a binary weighted arrangement in which the resistors 504 are omitted and the resistors 506 have a resistance value that is binary weighted. For example, each resistor 506-*n* has a resistance of R/(2^n).

Figure 6:
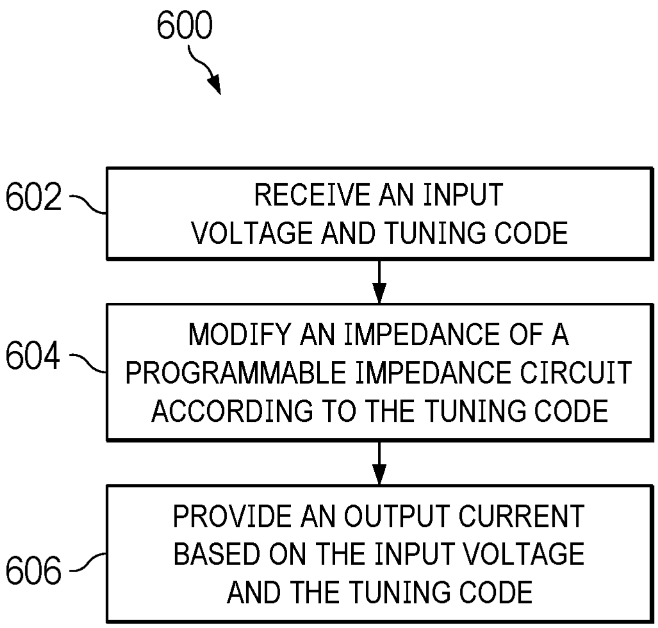
FIG. 6 is a flow diagram of an example method for controlling a voltage-controlled current source.

FIG. 6 is a flow diagram of an example method 600 for controlling a voltage-controlled current source. In some examples, the voltage-controlled current source is a tunable transconductor, as described herein, such as the tunable transconductor 104, 300, and/or 400.

At operation 602, an input voltage and a tuning code are received. In some examples, the input voltage is VIN and the tuning code is TUNE, each as described above herein. In some examples, the input voltage may be scaled after receipt, such as described above herein, to form VINDIV. In examples in which the input voltage is not scaled, reference to VINDIV may be replaced by reference to the input voltage.

At operation 604, an impedance of a programmable impedance circuit is modified according to TUNE. In some examples, the programmable impedance circuit is the programmable impedance circuit 306, as described above herein. Based on a value of TUNE, an impedance of the programmable impedance circuit is modified, as described above herein, such as by switching segments of the programmable impedance circuit into or out of a path of current flow in the programmable impedance circuit.

At operation 606, an output current is provided based on a value of VIN and a value of TUNE. In some examples, the output current is IOUT, as described above herein. For example, IOUT is based on a value of VIN, which may be substantially unchanging in value, and may further vary in value linearly with respect to changes in value of TUNE.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party. Components described herein as switches may be implemented as one, or a combination of multiple, physical (e.g., mechanical or electromechanical) devices, or solid-state (e.g., semiconductor) devices, such as transistors.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A circuit, comprising:
- a first resistor having a first terminal coupled to an input voltage (VIN) terminal, and having a second terminal;
- a second resistor having a first terminal coupled to the second terminal of the first resistor, and having a second terminal coupled to a ground terminal;
- a programmable impedance circuit having a first terminal coupled to the second terminal of the first resistor, having a tuning input terminal, and having a third terminal;
- an amplifier having an inverting input terminal coupled to the ground terminal, a non-inverting input terminal coupled to the third terminal of the programmable impedance circuit, and having an output terminal; and
- a current mirror having a first terminal coupled to the output terminal of the amplifier, a second terminal coupled to the third terminal of the programmable impedance circuit, and a third terminal coupled to an output current (IOUT) terminal.

2. The circuit of claim 1, wherein the programmable impedance circuit has a fourth terminal coupled to the ground terminal.

3. The circuit of claim 1, further comprising:
- a first current source having a first terminal coupled to the third terminal of the programmable impedance circuit, and having a second terminal coupled to the ground terminal; and
- a second current source having a first terminal coupled to the IOUT terminal, and having a second terminal coupled to the ground terminal.

4. The circuit of claim 1, wherein the current mirror includes:
- a first transistor having a control terminal coupled to the output terminal of the amplifier, a second terminal coupled to the third terminal of the programmable impedance circuit, and having a second terminal;
- a third resistor having a first terminal coupled to the second terminal of the first transistor, and having a second terminal;
- a fourth resistor having a first terminal coupled to the second terminal of the third resistor, and having a second terminal; and
- a second transistor having a control terminal coupled to the output terminal of the amplifier, a first terminal coupled to the second terminal of the fourth resistor, and a second terminal coupled to the IOUT terminal.

5. The circuit of claim 1, wherein the current mirror implements dynamic element matching.

6. The circuit of claim 5, wherein the current mirror includes:

first, second, and third transistors, each having respective control terminals coupled to the output terminal of the amplifier, and having respective first and second terminals;

a third resistor having a first terminal coupled to the second terminal of the first transistor, and having a second terminal;

a fourth resistor having a first terminal coupled to the second terminal of the third resistor, and having a second terminal;

a fifth resistor having a first terminal coupled to the second terminal of the third resistor, and having a second terminal;

a first single pole, three throw (SP3T) switch having a first terminal coupled to first terminal of the first transistor, a second terminal coupled to the third terminal of the programmable impedance circuit, and a third terminal coupled to the IOUT terminal;

a second SP3T switch having a first terminal coupled to first terminal of the second transistor, a second terminal coupled to the third terminal of the programmable impedance circuit, and a third terminal coupled to the IOUT terminal; and a third SP3T switch having a first terminal coupled to first terminal of the third transistor, a second terminal coupled to the third terminal of the programmable impedance circuit, and a third terminal coupled to the IOUT terminal.

7. The circuit of claim 6, further comprising:

a first current source having a first terminal coupled to the third terminal of the programmable impedance circuit, and having a second terminal coupled to the ground terminal; and a second current source having a first terminal coupled to the IOUT terminal, and having a second terminal coupled to the ground terminal.

8. The circuit of claim 1, wherein the programmable impedance circuit includes a switched resistor ladder.

9. The circuit of claim 8, wherein the programmable impedance circuit includes a number of segments each having:

a third resistor having a first terminal that is an input terminal of the segment, and having a second terminal that is an output terminal of the segment;

a fourth resistor having a first terminal coupled to the first terminal of the third resistor, and having a second terminal;

a first switch having a first terminal coupled to the second terminal of the fourth resistor, and having a second terminal coupled to the non-inverting input terminal of the amplifier; and a second switch having a first terminal coupled to the second terminal of the fourth resistor, and having a second terminal coupled to the ground terminal.

10. The circuit of claim 9, wherein the number of segments equals a number of bits of a digital tuning code received at the tuning input terminal, and wherein the segments are coupled in series between the second terminal of the first resistor and the ground terminal.

11. A circuit, comprising:

a voltage divider configured to receive an input voltage (VIN) and provide a divided input voltage (VINDIV);

a programmable impedance circuit coupled to the voltage divider and configured to:

receive VINDIV;

receive a digital tuning code; and modify an impedance of the programmable impedance circuit, as presented to an outside component, based on a value of the digital tuning code;

a current mirror coupled to the programmable impedance circuit an output current (IOUT) terminal;

and an amplifier coupled in a negative feedback topology to the programmable impedance circuit and the current mirror, the amplifier configured to drive the current mirror to cause the current mirror to provide IOUT at the IOUT terminal having an amount of current based on VIN and linearly proportional to the digital tuning code.

12. The circuit of claim 11, wherein the current mirror implements dynamic element matching.

13. The circuit of claim 11, wherein the amplifier forms a virtual ground to which the programmable impedance circuit and the current mirror couple.

14. The circuit of claim 11, wherein the programmable impedance circuit implements a switch R-2R topology.

15. The circuit of claim 11, wherein the programmable impedance circuit implements a binary weighted topology.

16. The circuit of claim 11, further comprising a current source coupled to the current mirror, the current source configured to draw an amount of current from the current mirror, the amount of current determined to prevent a reverse flow of current through the current mirror responsive to a positive value VIN.

17. A method, comprising:

receiving an input voltage and a tuning code;

dividing the input voltage by a voltage divider to provide a divided input voltage;

providing the divided input voltage to an input of a programmable impedance circuit, the programmable impedance circuit configured to present a constant impedance to the voltage divider irrespective of a value of the tuning code and to present a variable impedance at an output of the programmable impedance circuit based on the value of the tuning code; and providing an output current based on a value of the divided input voltage and on a value of the variable impedance.

18. The method of claim 17, wherein the output current varies linearly with respect to a change in the value of the tuning code.

19. The method of claim 17, further comprising switching one or more segments of a resistor ladder into a path of current flow in the programmable impedance circuit.

20. The method of claim 17, further comprising applying an offset current determined to prevent a reverse flow of current through the programmable impedance circuit responsive to a positive value VIN.

* * * * *